United States Patent [19]

Scriber et al.

[11] Patent Number: 5,483,185
[45] Date of Patent: Jan. 9, 1996

[54] METHOD AND APPARATUS FOR DYNAMICALLY SWITCHING BETWEEN ASYNCHRONOUS SIGNALS WITHOUT GENERATING GLITCHES

[75] Inventors: Mike Scriber, North Plains; Jim Warren, Hillsboro, both of Oreg.

[73] Assignee: Intel Corporation, Santa Clara, Calif.

[21] Appl. No.: 257,721

[22] Filed: Jun. 9, 1994

[51] Int. Cl.$^6$ .................. H03L 7/00; H03K 3/64
[52] U.S. Cl. .............. 327/99; 327/298; 327/144; 326/96
[58] Field of Search ............. 327/99, 144, 142, 327/292, 298, 379; 326/28, 26, 96; 331/49

[56] References Cited

U.S. PATENT DOCUMENTS

| | | | |
|---|---|---|---|
| 3,226,648 | 1/1962 | Davidson | 327/298 |
| 4,968,899 | 11/1990 | Katsutani et al. | 327/99 |
| 4,970,405 | 11/1990 | Hagiwara | 327/99 |

Primary Examiner—Timothy P. Callahan
Assistant Examiner—Jung Ho Kim
Attorney, Agent, or Firm—Owen L. Lamb

[57] ABSTRACT

A dynamic clock switching circuit in which a multiplexer (MUX) is connected to clock A and clock B. MUX control lines are encoded to signal clock A or clock B. A MUX control change detector is connected to the multiplexer and to the MUX control lines. A MUX control change detector decodes the MUX control lines and asserts a MUX change signal upon a condition that a change from one clock to another is signaled. A Hold Sync flip-flop is connected to a hold output of a Hold Start flip-flop. The Hold Sync flip-flop is connected to and clocked by the clock A. A Hold Disable flip-flop is connected to an OK to change output of the Hold Sync flip-flop. The Hold Disable flip-flop is connected to and clocked by clock A. A Clock Sync flip-flop is connected to a hold disable output of the Hold Disable flip-flop. A reset input of the Hold Start flip-flop is connected to a clock sync output of the Clock Sync flip-flop. An AND is connected to the hold output and to the hold disable output. An OR is connected to the MUX output and to an output of the AND. The OR has a gated clock output. A second OR is connected to the hold output and to the gated clock output. The second OR has a clock output. The Clock Sync flip-flop being clocked by the gated clock output. The hold start flip-flop is set by the MUX change signal and clocked by the clock output. The MUX control change detector is connected to the OK to change output of the Hold Sync flip-flop. The MUX control change detector includes logic for causing the MUX control lines to be gated to the multiplexer.

13 Claims, 3 Drawing Sheets

METHOD AND APPARATUS FOR DYNAMICALLY SWITCHING BETWEEN ASYNCHRONOUS SIGNALS WITHOUT GENERATING GLITCHES

BACKGROUND OF THE INVENTION

1. Field of the Invention

The present invention is related to personal computers and more particularly to an apparatus for dynamically switching between asynchronous signals without generating glitches.

2. Background Art

The flow of information through the internal circuits of a computer is synchronized by an electronic circuit called a clock that generates evenly spaced timing pulses at high speeds. IBM Personal Computers are marketed to various market segments at price/performance levels that basically are related to the clock speed at which the microprocessor operates. This speed determines the kinds of peripheral devices, such as printers and monitors, and memory devices that can be used with the base machine. For example, the Intel 386 DX family of processors are available at speeds of 16, 20, 25 and 33 megahertz (MHz), at proportionally increasing prices.

The main hardware part of a personal computer (PC) is called a mother board which is a large printed circuit board that has plugged into it the computers central processing unit (CPU), which is an INTEL brand or compatible microprocessor, random access memory (RAM), and microprocessor support chips. The mother board has expansion slots that receive add-in cards that plug into the expansion slots. The IBM PC architecture uses the MICROSOFT brand disc operating system (DOS) as the software program that controls the overall operation of the computer by instructing the computer what to do and when to do it.

Modern computer systems are usually designed in a fully synchronous fashion. This often requires distribution of a large number of low skew clocks throughout the system. In some circumstances, there may be several choices for what the speed of this clock is and a method of dynamically switching between different clocks, i.e. between asynchronous signals, without generating glitches must be devised.

The most common way of switching between a plurality of clocks is manually by human intervention. The person configuring the system is instructed to shut off power to the computer and to insert an appropriate jumper to select the proper clock. This method is subject to human error and cannot be performed dynamically while the machine is in operation.

Another approach is to have a standard multiplexer switch between the clocks. The multiplexer approach provides dynamic switching, but it also generates spurious, unwanted signals called glitches on the resulting clock signal. Glitches may cause the computer operation to malfunction or perform erratically.

It is an object of this invention to provide a method and apparatus for dynamically switching between asynchronous clock signals without generating glitches.

SUMMARY OF THE INVENTION

Briefly, the above object is accomplished in accordance with the invention by providing a multiplexer (MUX) connected to a clock A and a clock B. MUX control lines are encoded to signal clock A or clock B. A MUX control change detector is connected to the multiplexer and to the MUX control lines. A MUX control change detector decodes the MUX control lines and asserts a MUX change signal upon a condition that a change from one clock to another is signaled. A Hold Sync flip-flop is connected to a hold output of a Hold Start flip-flop. The Hold Sync flip-flop is connected to and clocked by the clock A. A Hold Disable flip-flop is connected to an OK to change output of the Hold Sync flip-flop. The Hold Disable flip-flop is connected to and clocked by clock A. A Clock Sync flip-flop is connected to a hold disable output of the Hold Disable flip-flop. A reset input of the Hold Start flip-flop is connected to a clock sync output of the Clock Sync flip-flop. An AND is connected to the hold output and to the hold disable output. An OR is connected to the MUX output and to an output of the AND. The OR has a gated clock output. A second OR is connected to the hold output and to the gated clock output. The second OR has a clock output. The Clock Sync flip-flop is clocked by the gated clock output. The hold start flip-flop is set by the MUX change signal and clocked by the clock output. The MUX control change detector is connected to the OK to change output of the Hold Sync flip-flop. The MUX control change detector includes logic for causing the MUX control lines to be gated to the multiplexer.

An advantage of this invention is that the clocks can be switched dynamically without generating glitches.

A further advantage of this invention is that clock switching can be controlled by software, hardware, or a combination of both software and hardware.

The foregoing and other objects, features, and advantages of the invention will be apparent from the following more particular description of a preferred embodiment of the invention as illustrated in the accompanying drawings.

DESCRIPTION OF THE PREFERRED EMBODIMENT

Figure 1:
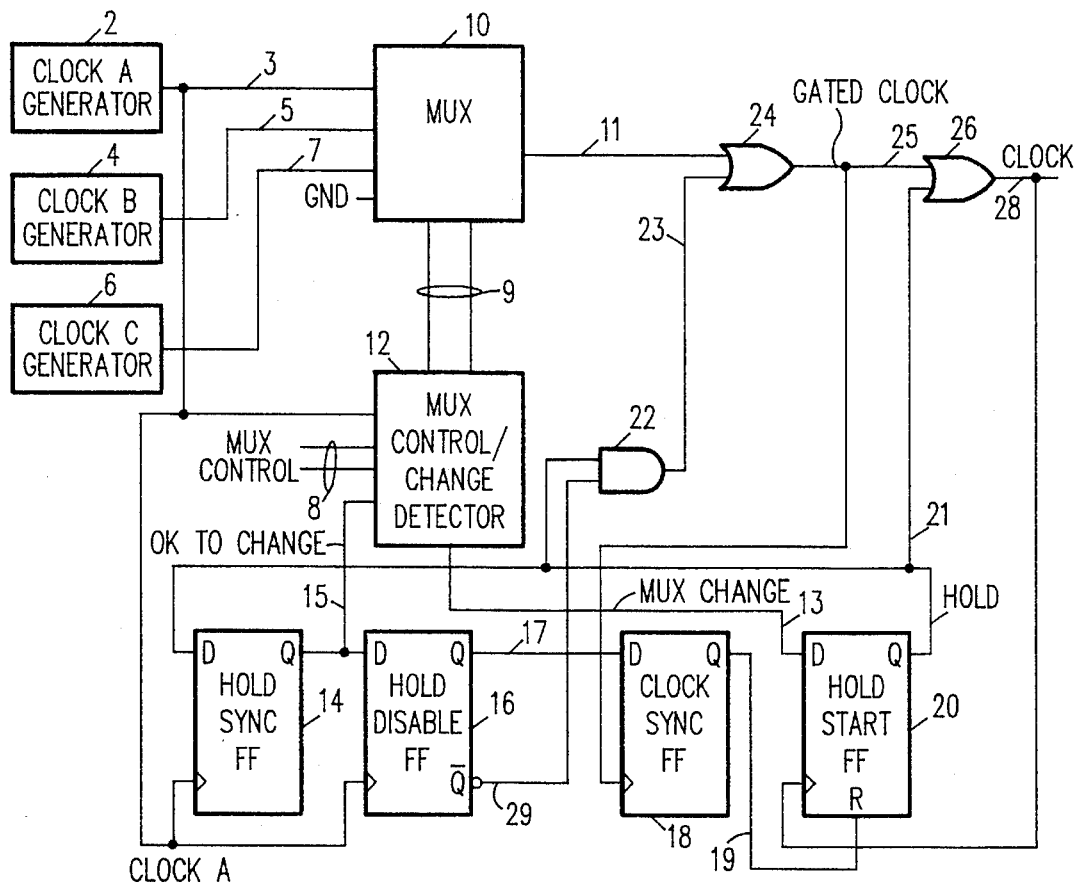
FIG. 1 is a diagram of a dynamic clock switching circuit in accordance with the present invention.

FIG. 1 is a diagram of a dynamic clock switching circuit constructed in accordance with the present invention. The circuit consists of a multiplexer or MUX (10), a MUX control change detector (12), Hold Sync FF (14), Hold Disable FF (16), Clock Sync FF (18) and Hold Start FF (20). AND (22), OR (24) and OR (26) are provided to isolate the clock output. The circuit receives inputs from clock A generator (2), clock B generator (4), and clock C generator (6).

Figure 2:
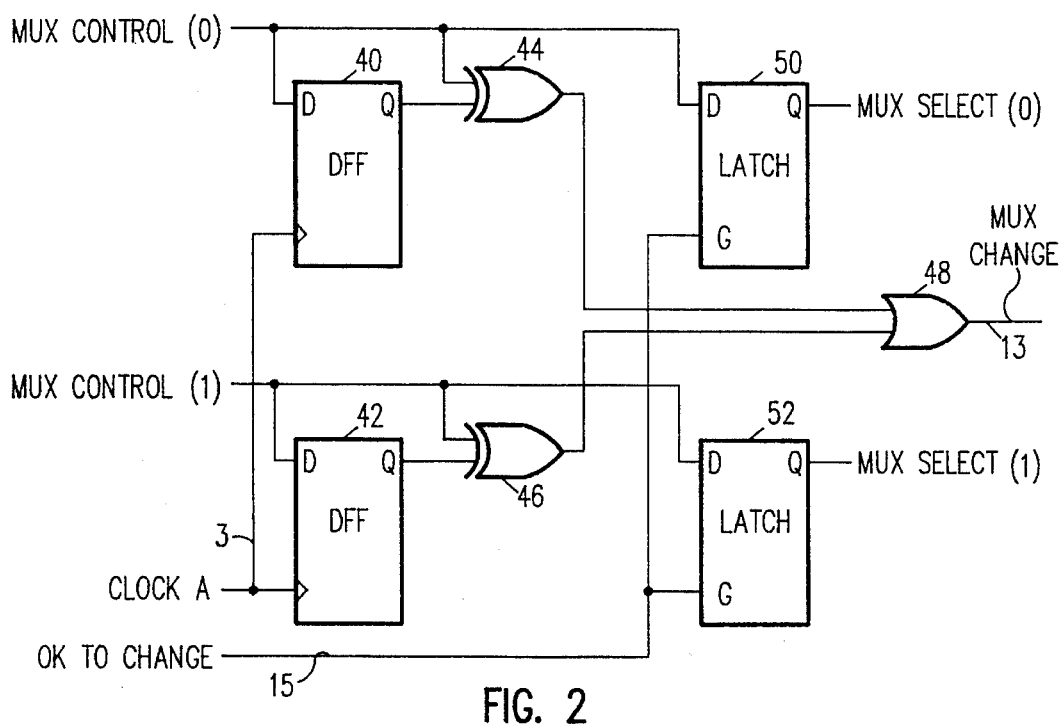
FIG. 2 is a diagram of the MUX Control/Change detector circuit shown in FIG. 1.

Refer to FIG. 2 which is a diagram of the MUX Control/Change detector (12) shown in FIG. 1. The MUX control/change detector (12) stores the MUX select value in two latches (50, 52). The output of latch (50) is MUX select (0) and the output of latch (52) is MUX select (1), which comprise the MUX select pair (9) shown in FIG. 1. The MUX select lines provide an encoding for up to four values corresponding to four clock inputs.

The MUX control input pair (8) shown in FIG. 1 is comprised of MUX control (0) and MUX control(1) as shown in FIG. 2. Two Data Flip-flops (DFF) are provided to sample and store an encoded value on the MUX control inputs using the CLK A input (3) as a sampling signal to clock the flip-flops. The Q output of DFF (40) drives one leg of exclusive OR (44). The other leg of exclusive OR (44) is driven by MUX control (0). The Q output of DFF (42) drives one leg of exclusive OR (46). The other leg of exclusive OR (46) is driven by MUX control (1). The outputs of the exclusive ORs (44, 46) drive an OR (48). An exclusive OR asserts its output if one and only one of its inputs is asserted. If both inputs are unasserted, the output of an exclusive OR is unasserted. The exclusive ORs (44, 46) compare the stored value in the flip-flops (40, 42) with the value on the MUX control inputs. When there is a difference in values, the output of OR (48) asserts the MUX change (13). The OK to change line (15) gates the values on the MUX control (0) and MUX control (1)into the latches (50, 52).

It will be understood by those skilled in the art that the circuit shown in FIG. 2, which has two MUX control inputs, will handle up to four clock encoded values. More encodings can be accommodated by supplying additional flip-flops, exclusive Ors, latches and support circuitry. A simpler circuit using only one control input that is also the MUX change output, and a gate that is energized by the OK to change line may be provided for switching between two clocks.

Figure 3:
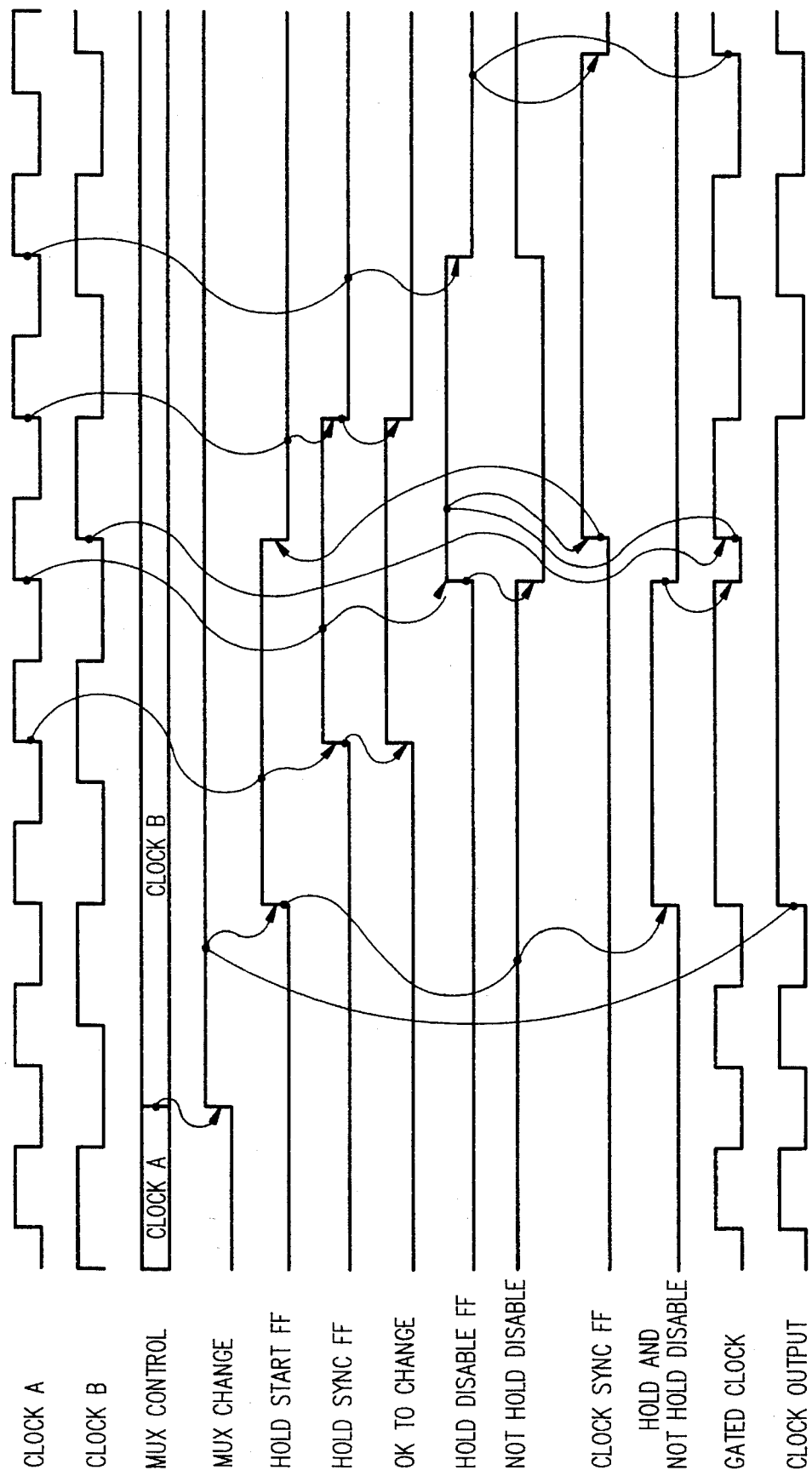
FIG. 3 is a timing diagram of the operation of the circuit of FIG. 1.

Refer to FIG. 3 which is a timing diagram of the operation of the circuit of FIG. 1. The MUX control/change detector (12) stores a current value for the clock and that current value drives the MUX select inputs (9). The MUX control/change detector (12) continuously compares the stored value with a value placed on the MUX control inputs (8). When the two MUX control lines (8) signal a change to a different clock encoding, for example a coding from clock A to clock B, the clock A input to the MUX control/change detector (12) asserts a MUX change signal (13). When the MUX change signal is high at a time that the clock output (28) goes high, the Hold Start flip-flop (20) is turned on causing the Hold signal (21) to go high. The Hold signal is then used to change the clock MUX (10) by turning on the Hold Sync FF (14) clocked by a rising edge of clock A. The OK to change output (15) of the Hold Sync FF enters the MUX control/change detector to cause the MUX control inputs (9) to be gated to the MUX (10) via the MUX control outputs (9). The output of the Hold Sync FF being high causes the Hold Disable FF (16) to be turned on at a rising edge of clock A. The Not Hold Disable line (29), which is the Hold Disable Inverted output of the Hold Disable FF (16), is used at AND (22) to allow the new clock (clock B) at the MUX output (23) to pass through the OR (24), the output of which is the gated clock signal (25). The output of the hold disable FF being high causes the gated clock signal (25) to turn on the Clock Synchronizer FF (18). The Clock Synchronizer FF drives the asynchronous reset of the Hold Start FF (20) which causes the Hold signal (21) to become unasserted. Since the Hold signal is not asserted, the gated clock output from the MUX, which is now clock B, is allowed to pass through the OR (26) and drive the clock output (28). the clock sync FF is reset by a rising edge of the gated clock (25). the hold disable FF (16) is reset by the next rising edge of clock A after the output of the hold sync FF (14) is unasserted.

Figure 4:
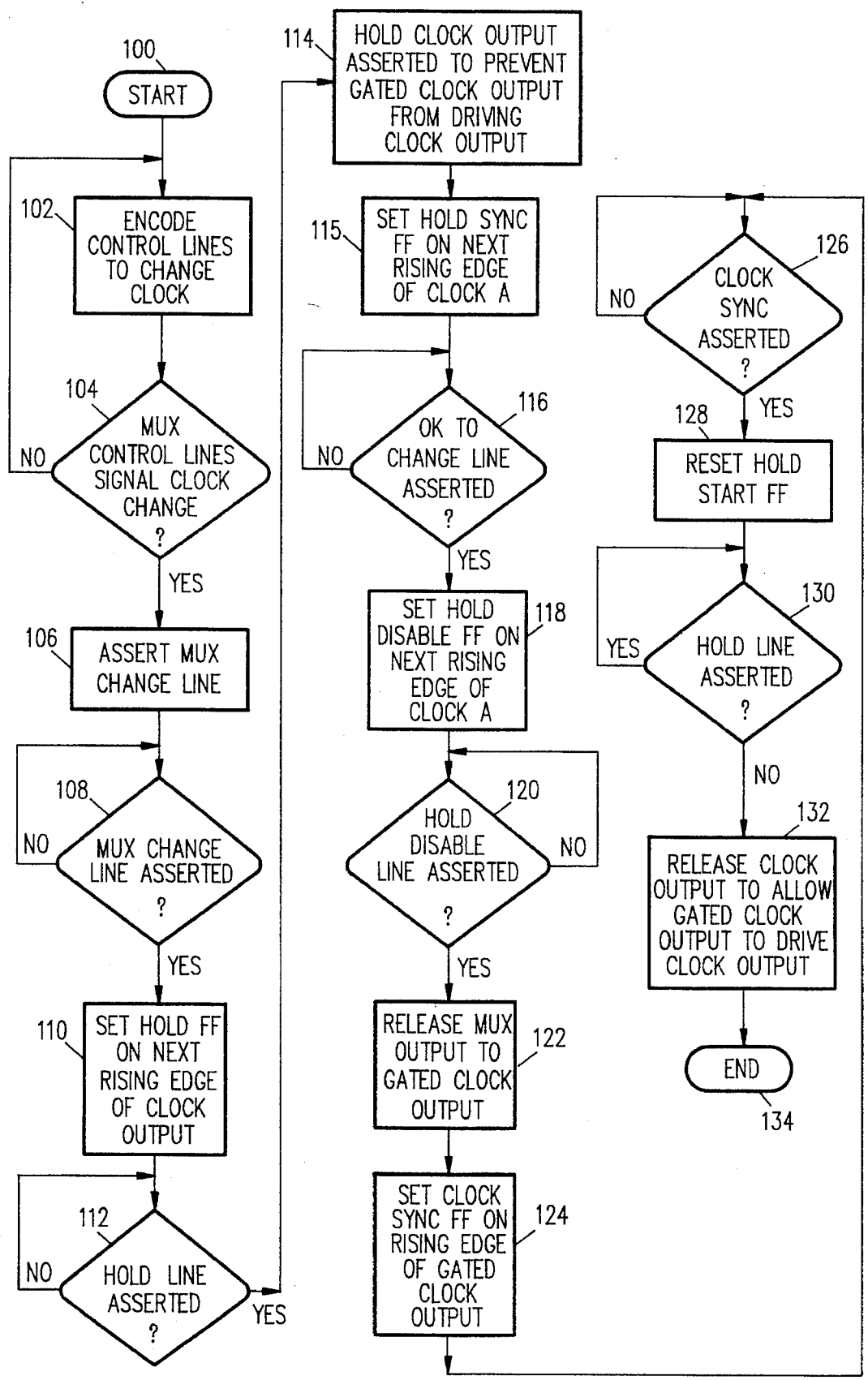
FIG. 4 is a flow diagram of a method of dynamic clock switching in accordance with the present invention.

Refer to FIG. 4 which is a flow diagram of a method of dynamic clock switching. Control lines are encoded to signal a change from one clock to a different clock (102). If the control lines signal a clock change to (104) a MUX change line is asserted (106). If the MUX change line is asserted (108) the hold FF is set on the next rising edge of clock output (110). When the hold FF is set, its output, the hold line, is asserted (112). Thus the hold line is asserted upon a condition that the control lines signal a clock change. A hold sync FF circuit is set (115) in response to the hold line, that is, the hold sync FF is set to a first state. An OK to change line is asserted upon a condition that the hold sync circuit is set by the hold line. If the OK to change line is asserted (116), the hold disable FF is set on the next rising edge of clock A (118). If the hold disable output is asserted (120) and the hold line is asserted (112), the MUX output is released to the gated clock output (122). The clock sync FF is set on the rising edge of the gated clock output (124). When the clock sync output is asserted (126) the hold start FF is reset asynchronously. When the hold line is unasserted (130) the clock output is released, consequently, the gated clock output is passed through to the clock output (132) and the flow ends (134).

Thus, the hold line is unasserted at a time subsequent to the hold sync circuit being set to the first state (115).

While the invention has been particularly shown and described with reference to preferred embodiments thereof, it will be understood by those skilled in the art that the foregoing and other changes in form and detail may be made therein without departing from the scope of the invention.

What is claimed is:

1. A clock switching circuit comprising:

a clock A;

a clock B;

a multiplexer (10) connected to said clock A and said clock B;

said multiplexer (10) having a MUX output (11);

a MUX control input (8);

said MUX control input being a clock encoding of a selection between clock A and clock B as the output of said multiplexer;

a MUX change signal (13);

a MUX control change detector (12) connected to said multiplexer and to said MUX control input (8);

said MUX control change detector (12) having MUX SELECT outputs;

said MUX control change detector (12)including logic for decoding said MUX control input (8) and for asserting said MUX change signal (13) upon a condition that a change is to occur from one to another of clock A and clock B at the output of said multiplexer;

a Hold Start flip-flop (20);

a Hold Sync flip-flop (14) connected to and set by a hold output (21) of said Hold Start flip-flop;

said Hold Sync flip-flop being connected to and clocked by said clock A;

said Hold Sync flip-flop (14) having an OK TO CHANGE output (15) connected to said MUX control change detector (12);

said OK TO CHANGE output (15) preventing an assertion of said MUX select outputs upon a condition that said Hold Sync flip-flop (14) is set;

a Hold Disable flip-flop (16) connected to said OK TO CHANGE output (15) of said Hold Sync flip-flop;

said Hold Disable flip-flop being connected to and clocked by said clock A;

a Clock Sync flip-flop (18) connected to and set by a hold disable output (17) of said Hold Disable flip-flop;

a reset input of said Hold Start flip-flop (20) being connected to a clock sync output (19) of said Clock Sync flip-flop;

an AND logic (22) connected to said hold output (21) and to a not hold disable output (29) of said Hold Disable flip-flop;

an OR logic (24) connected to said MUX output (11) and to an output (23) of said AND logic (22);

said OR logic (24) having a gated clock output (25); and, an OR logic (26) connected to said hold output (21) and to said gated clock output (25);

said OR logic (26) having a clock output (28);

said Clock Sync flip-flop being clocked by said gated clock output (25);

said hold start flip-flop being set by said MUX change signal (13) and clocked by said clock output (28);

said hold start flip-flop being reset upon a condition that said clock sync flip-flop is set.

2. The combination in accordance with claim 1 wherein:

said MUX control change detector (12) is connected to said an OK TO CHANGE output (15) of said Hold Sync flip-flop; and, said MUX control change detector (12) includes logic for causing said MUX control (8) to be gated to said multiplexer (10).

3. The combination in accordance with claim 1 wherein said MUX control change detector (12) comprises:

a flip-flop (40) connected to said MUX control input (8);

said flip-flop (40) storing a value manifesting one of said clock A and said clock B;

a latch (50) connected to said MUX control input (8);

said latch (50) storing a value manifesting one of said clock A and said clock B; and, an exclusive OR logic (44) connected to an output of said flip-flop (40) and to said MUX control input (8).

4. The combination in accordance with claim 2 wherein said MUX control change detector (12) comprises:

a flip-flop (40) connected to said MUX control input (8);

said flip-flop (40) storing a value manifesting one of said clock A and said clock B;

a latch (50) connected to said MUX control input (8).

said latch (50) storing a value manifesting one of said clock A and said clock B; and, an exclusive OR logic (44) connected to an output of said Flip-flop (40) and to said MUX control input (8).

5. A clock switching circuit comprising:

first clock means for generating a clock A output;

second clock means for generating a clock B output;

a multiplexing means (10) connected to said clock A output and to said clock B output;

said multiplexing means (10) having an output (11);

control inputs (8) encoded to signal a clock encoding of a selection between clock A and clock B as the output of said multiplexing means;

a change signal (13);

detection means (12) connected to said multiplexing means and to said control inputs (8);

said detection means (12) having MUX SELECT outputs;

said detection means (12) including logic means for decoding said control inputs (8) and for asserting said change signal (13) upon a condition that a change from one to another of said clock A and clock B occurs;

Hold Start means (20);

Hold Sync means (14) connected to a hold output (21) of said Hold Start means for generating an OK TO CHANGE output (15);

said Hold Sync means being connected to and clocked by said clock A output;

said Hold Sync flip-flop (14) having an OK TO CHANGE output (15) connected to said MUX control change detector (12);

said OK TO CHANGE output (15) preventing an assertion of said MUX select outputs upon a condition that said Hold Sync flip-flop (14) is set;

Hold Disable means (16) connected to said an OK TO CHANGE output (15) of said Hold Sync means;

said Hold Disable means being connected to and clocked by said clock A output;

Clock Sync means (18) connected to and set by a hold disable output (17) of said Hold Disable means;

a reset input of said Hold Start means (20) being connected to a clock sync output (19) of said Clock Sync means;

a gate means (22) connected to said hold output (21) and to a not hold disable output (17) of said Hold Disable means;

a first OR means (24) connected to said MUX output (11) and to an output (23) of said gate means (22);

said first OR means (24) having a gated clock output (25); and, a second OR means (26) connected to said hold output (21) and to said gated clock output (25);

said second OR means (26) having a clock output (28);

said Clock Sync means being clocked by said gated clock output;

said hold start means being set by said change signal (13) and clocked by said clock output (28);

said hold start means being reset upon a condition that said clock sync means is set.

6. The combination in accordance with claim 5 wherein:

said detection means (12) is connected to said an OK TO CHANGE output (15) of said Hold Sync means; and, said detection means (12) includes logic for causing said control inputs (8) to be gated to said multiplexing means (10).

7. The combination in accordance with claim 5 wherein said detection means (12) comprises:

first means (40) connected to said control inputs (8) for storing a value manifesting one of said clock A and said clock B;

second means (50) connected to said control inputs (8) for storing a value manifesting one of said clock A and said clock B;

comparing means (44) connected to an output of said first means (40) and said control inputs (8); and, an output (13) responsive to said comparing means (44).

8. The combination in accordance with claim 6 wherein said detection means (12) comprises:

first means (40) connected to said control inputs (8) for storing a value manifesting one of said clock A and said clock B;

second means (50) connected to said control inputs (8) for storing a value manifesting one of said clock A and said clock B;

comparing means (44) connected to an output of said first means (40) and to said control inputs (8); and, an output (13) responsive to said comparing means (44).

9. A method comprising steps of:
   A. selecting, in response to a control line, between one of an input clock A and an input clock B;
   B. placing a selected one of said input clock A and said input clock B on a clock output;
   C. detecting a condition of a change from one to another of clock A and clock B;
   D. signaling a multiplexer to change its output from one to another of clock A and clock B upon said condition of a change from one to another of clock A and clock B and an OK TO CHANGE line being asserted;
   E. asserting a hold line upon said condition of a change from one to another of clock A and clock B;
   F. inhibiting said clock output as long as said hold line is asserted;
   G. setting a hold sync circuit to a first state in response to said hold line being asserted;
   H. asserting said OK TO CHANGE line upon a condition that said hold sync circuit is set to said first state; and,
   I. unasserting said hold line at a predetermined time subsequent to said hold sync circuit being set to said first state, said predetermined time being synchronized with said clock output.

10. The method in accordance with claim 9 wherein said step F of inhibiting said clock output as long as said hold line is asserted further comprises steps of:
    J. setting a hold disable circuit in response to said OK TO CHANGE line being asserted; and,
    K. using an inverted output of said hold disable circuit to inhibit said clock output.

11. The method in accordance with claim 10 wherein said step I of unasserting said hold line at a predetermined time subsequent to said hold sync circuit being set to said first state, said predetermined time being synchronized with said gated clock output, further comprises steps of:
    L. setting a clock sync circuit in response to said hold disable circuit being asserted; and,
    M. using an output of said clock sync circuit to cause said hold line be unasserted at said predetermined time subsequent to said hold sync circuit being set to said first state.

12. The method in accordance with claim 9 wherein said step E further comprises steps of:
    J. setting a hold start circuit upon a condition of a change from one to another of clock A and clock B; and,
    K. using an output of said hold start circuit to cause said hold line be asserted at said predetermined time subsequent to said hold sync circuit being set to said first state.

13. The method in accordance with claim 12 wherein said step E further comprises steps of:
    L. setting a hold start circuit upon said condition of a change from one to another of clock A and clock B; and,
    M. using an output of said hold start circuit to cause said hold line to be asserted at said predetermined time subsequent to said hold sync circuit being set.

* * * * *

UNITED STATES PATENT AND TRADEMARK OFFICE
CERTIFICATE OF CORRECTION

PATENT NO. : 5,483,185
DATED : January 9, 1996
INVENTOR(S) : Scriber, et. al.

It is certified that error appears in the above-indentified patent and that said Letters Patent is hereby corrected as shown below:

Column 5, line 44, change "(8)." to -- (8); --.

Signed and Sealed this

Ninth Day of April, 1996

Attest:

BRUCE LEHMAN

Attesting Officer

Commissioner of Patents and Trademarks